(12) United States Patent
Krishnamoorthy

(10) Patent No.: US 6,732,066 B2
(45) Date of Patent: *May 4, 2004

(54) METHOD OF DETERMINING STATIC FLIP-FLOP SETUP AND HOLD TIMES

(75) Inventor: Suresh Krishnamoorthy, Milpitas, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 465 days.

This patent is subject to a terminal disclaimer.

(21) Appl. No.: 09/820,393

(22) Filed: Mar. 28, 2001

(65) Prior Publication Data

US 2001/0014851 A1 Aug. 16, 2001

Related U.S. Application Data

(63) Continuation of application No. 09/150,508, filed on Sep. 9, 1998.

(51) Int. Cl.[7] .................................................. G06F 17/50
(52) U.S. Cl. ............................ 703/14; 703/14; 716/2; 716/6
(58) Field of Search ....................... 703/2, 13–19; 716/2, 6–7

(56) References Cited

U.S. PATENT DOCUMENTS 5,559,715 A * 9/1996 Misheloff .................... 703/19
5,650,947 A * 7/1997 Okumura .................... 703/16
5,768,159 A * 6/1998 Belkadi et al. ............... 703/19

OTHER PUBLICATIONS

Lam et al, "Valid Clock Frequencies and Their Computation in Wavepiplined Circuits," IEEE Transactions on Computer–Aided Design of Integrated Circuits and Systems, vol. 15 No. 7, pp. 791–807 (Jul. 1996).*

Lam et al, "Valid Clocking in Wavepiplined Circuits," 1992 IEEE/ACM International Conference on Computer–Aided Design, pp. 518–525 (Nov. 1992).*

* cited by examiner

*Primary Examiner*—Samuel Broda
(74) *Attorney, Agent, or Firm*—Gunnison, McKay & Hodgson, L.L.P.; Philip J. McKay

(57) ABSTRACT

A method for determining the setup and hold times of static flip-flops during the design and development of integrated circuits. The method utilizes simulations of an integrated circuit to determine a first amount of time required for a data signal to be transmitted from a first external node to a predetermined node in the register of a static flip-flop, and a second amount of time required for a clock signal to be transmitted from a second external node to the predetermined node. The setup time is determined by calculating a difference between the first amount of time from the second amount of time. Similarly, a hold time for the flip-flop is determined by calculating a difference between the amounts of time required for data and the clock signal to reach a second predetermined internal node of the flip-flop.

10 Claims, 5 Drawing Sheets

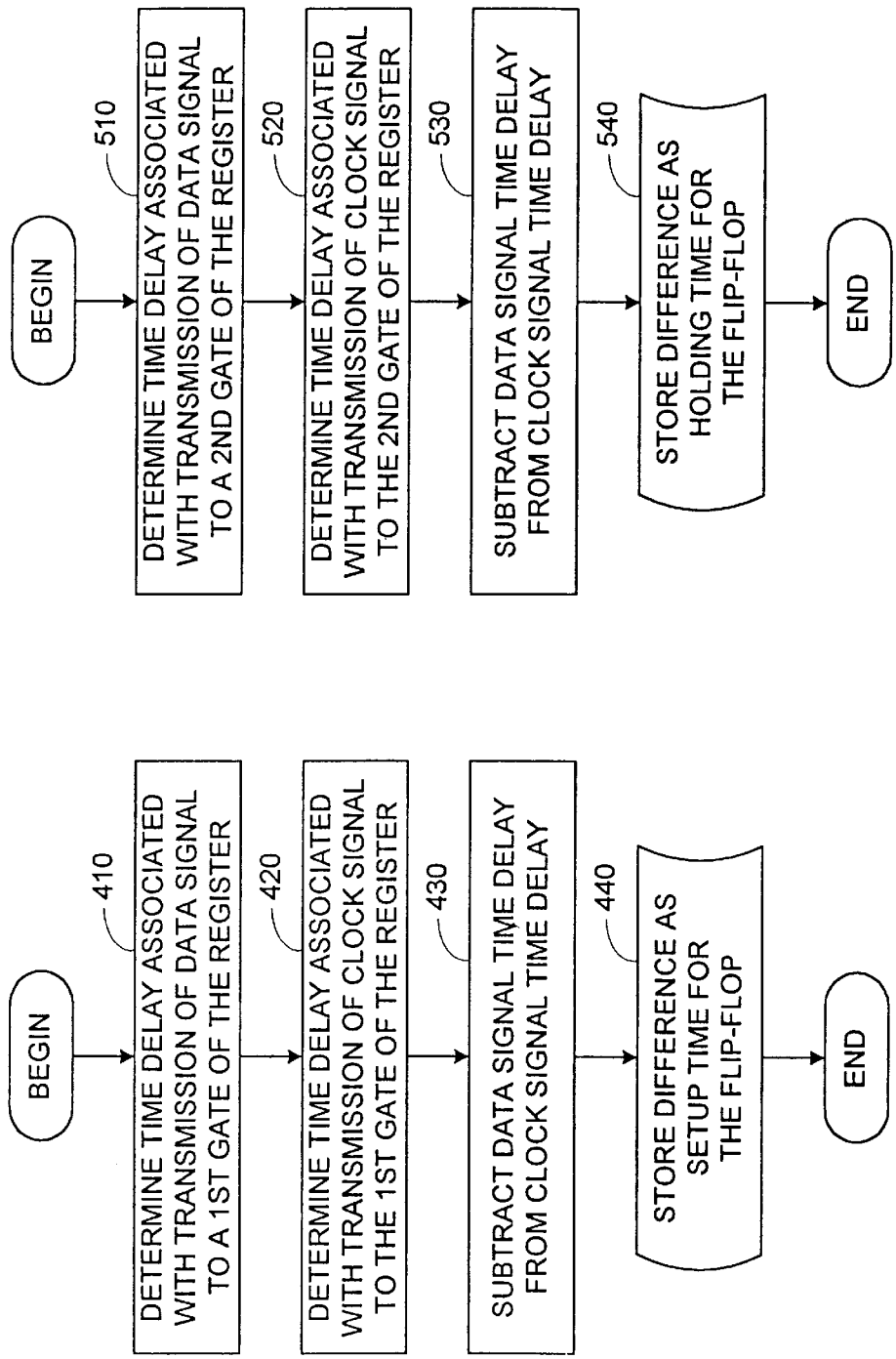

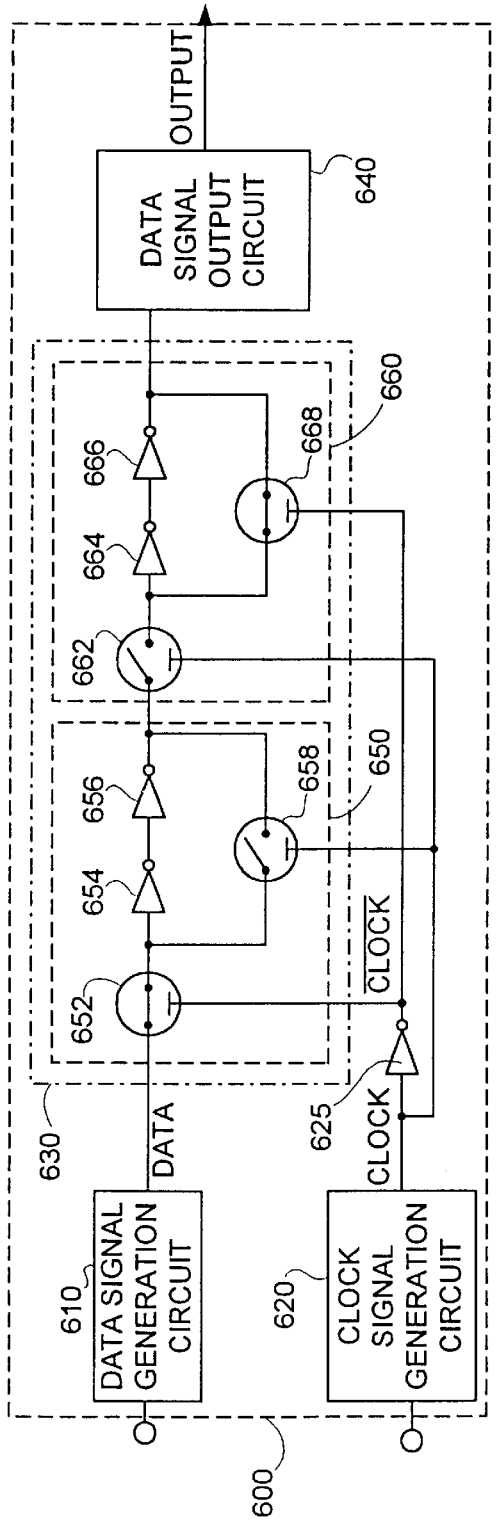
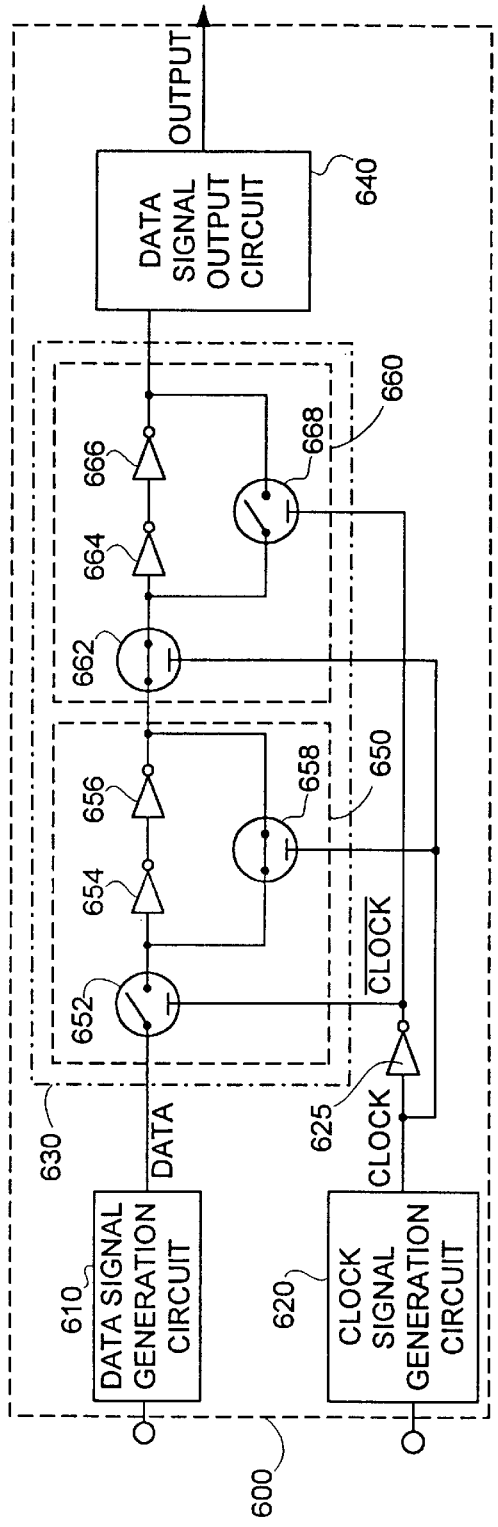
FIG. 7A
FIG. 7B

METHOD OF DETERMINING STATIC FLIP-FLOP SETUP AND HOLD TIMES

This is a continuation of Ser. No. 09/150,508 filed on Sep. 9, 1998.

FIELD OF THE INVENTION

This invention relates to the field of integrated circuits, and more specifically to flip-flops that are utilized as memory devices in integrated circuits.

BACKGROUND OF THE INVENTION

An integrated circuit (IC) typically includes a silicon semiconductor crystal, called a "chip", that is mounted in a ceramic or plastic package. The chip contains numerous electronic components forming digital gates and other necessary elements. The various electronic components are interconnected inside the chip to form a digital circuit. Bonding pads on the chip are welded to external pins or other external connection structures on the ceramic or plastic package. These external connection structures are used to connect the digital circuit of the IC to a printed circuit board (PCB) or other host system structure so that the IC can receive and transmit binary signals within the host system.

A "sequential" IC includes a digital circuit whose operating "state" at an instant in time is determined at least in part by binary information that is stored in the digital circuit. Specifically, sequential ICs typically include both "combinational" circuitry (e.g., arrays of digital gates) and memory elements. Combinational circuitry outputs binary information signals at any instant in time that are entirely dependent upon the input signals presented to the combinational circuitry at that instant. The memory elements store the binary information so that it is available, for example, for use by the combinational circuitry. In operation, a sequential IC receives binary input signals from a host system. These binary input signals, together with the binary information stored by the memory elements, determine the binary output signals transmitted from the sequential IC to the host system. The binary input signals and stored binary information also determine the conditions required for changing the binary information stored in the memory elements. Therefore, a time sequence of input signals, output signals and internal memory states determines the operating "state" of the sequential IC.

"Synchronous" sequential ICs utilize clock signals such that all changes to the binary information stored in the memory elements takes place just after each clock signal pulse. A common memory element used in synchronous sequential ICs is referred to as a "flip-flop". A static flip-flop is a circuit that can maintain a binary state indefinitely (as long as power is applied to the IC) until directed by an input signal to switch states. The flip-flop switches states in response to, for example, a rising edge of a clock signal (i.e., when the clock signal changes from "0" (low) to "1" (high)). There are several types of known flip-flops, including D, RS, JK and T type flip-flops.

FIG. 1 is a block diagram showing a portion of a flip-flop 100 that includes a data signal generation circuit 110, a clock signal generation circuit 120, a register 130, and a data signal output circuit 140. Data signal generation circuit 110 receives one or more data input signals I1, I2, I3, and generates a data signal DATA that is transmitted to a data input terminal IN of register 130. Similarly, clock signal generation circuit 120 receives one or more signals C1, C2 . . . , and generates a clock signal CLOCK that is transmitted to a clock input terminal (>) of register 130. Register 130 also includes an output terminal OUT from which a stored data signal is transmitted to data signal output circuit 140. Data signal output circuit 140 transmits a flip-flop output signal OUTPUT in response to the flip-flop output signal.

The particular circuit structures associated with the various components of a flip-flop vary depending upon the requirements of the circuit in which the flip-flop is used. For example, a single data input signal may transmitted to the input terminal of data register 130 through a data signal generation circuit 110 that is made up of an unimpeded conductive path. Conversely, multiple data input signals may be transmitted to a data signal generation circuit 110 that includes multiple logic gates that generate data signal DATA. Likewise, clock signal generation circuit may be a single conductive path transmitting a single clock input signal to the clock terminal of register 130, or may include a series of logic gates that generates the clock signal CLOCK in response to several clock input signals. Moreover, data signal output circuit 140 may include a simple conductive path, or may include one or more logic gates.

Register 130 typically stores the data signal DATA received at data input terminal IN during the rising edge of the clock signal (CLOCK) received at the clock input terminal, thereby determining the "set" or "reset" state of flip-flop 100. For example, if the data signal applied to input terminal IN is "1" when clock signal CLOCK transitions from "0" to "1", then flip-flop 100 is placed in a set state (i.e., the data signal "1" is stored in register 130 and generated at output terminal OUT). If the data signal at input terminal IN is "0" during the rising clock edge, then flip-flop 100 is placed in a reset state (i.e., the signal generated at output terminal OUT is "0").

FIG. 2 is a timing diagram showing data signals (DATA) generated by data signal generation circuit 110 (see FIG. 1) and clock signals (CLOCK) generated by clock signal generation circuit 120. These signals are transmitted to register 130 during operation of flip-flop 100. As mentioned above, data signal generation circuit 110 and clock signal generation circuit 120 often include combinatorial circuitry and/or buffers that introduce delays in the signal transmission of the data and clock signals to the input terminals of register 130. Because flip-flop 100 is placed in a set or reset state based on the data signal DATA applied to the data input terminal IN of register 130 when the clock signal CLOCK received at the clock input terminal (>) transitions from "0" to "1", it is important for the data signal DATA to be stabilized at the data input terminal for a time period, referred to as a setup time $t_s$, before the clock signal transition is received at the clock input terminal. For similar reasons, it is important for the data signal DATA to be stabilized at the data input terminal for a further time period, referred to as a hold time $t_h$, after the clock signal transition is received. As shown in FIG. 2, setup time $t_s$ and hold time $t_h$ of flip-flop 110 define a time period during which the data signal DATA must be stabilized at "0" (low) or "1" (high). Specifically, after a time period $t_1$ during which the data signal DATA may change between "0" and "1", setup time $t_s$ and hold time $t_h$ define a time period $t_2$ during which the data signal DATA must be stable (either "1" or "0"). When the hold time $t_h$ ends (i.e., during time period $t_3$), the data signal can again change between "0" (low) and "1" (high), as indicated in FIG. 2.

During the design and development of a synchronous sequential IC, it is important to know the setup and hold times of all flip-flops in order to maximize the operating speed. That is, the setup and hold times of each flip-flop 100 (see FIG. 1) differ depending upon the delays introduced by data signal generation circuit 110 and clock signal generation circuit 120. Because these circuits are typically different for each flip-flop of an IC, the delay associated with each flip-flop is typically different. By determining the setup and hold times for each flip-flop, the sequential IC can be optimized to minimize signal transmission delays, thereby maximizing operating speed.

FIG. 3 shows a conventional method for determining the setup time $t_s$ for a flip-flop that is utilized during the design and development of an asynchronous sequential IC. The conventional method utilizes an iterative approach to identify an optimal setup time $t_s$. In Step 310, an initial setup time $t_s$ is selected for a flip-flop that is at a high end of an expected range of setup times. In step 320, IC operation is simulated to determine whether the initial setup time is sufficient for proper operation of the flip-flop. In Step 330, if the selected setup time is insufficient, the flip-flop will malfunction (i.e., perform improperly) during the simulation. If the flip-flop functions properly, control passes on the "N" (no) branch to Step 340, where the setup time $t_s$ is modified (e.g., incrementally reduced or otherwise changed in accordance with a predetermined formula). Control then passes back to Step 320, where operation is again simulated. The loop formed by Steps 320, 330 and 340 is repeated until the flip-flop malfunctions in Step 340, at which time control passes along the "Y" branch. In accordance with the conventional method, the final setup time $t_s$ is the last value at which the flip-flop operates properly.

The conventional method for determining the hold time $t_h$ is similar to the method for determining the setup time $t_s$ disclosed above and in FIG. 3.

A problem with the conventional method of determining the setup time $t_s$ and the hold time $t_h$ of flip-flops is that the iterative approach typically requires twenty to thirty simulations (performed in Step 320, FIG. 3) before a minimum setup time $t_s$ or a minimum hold time $t_h$ is determined. When multiplied by the number of flip-flops found on a typical sequential IC, it is clear that a significant amount of design time is spent determining flip-flop setup and hold times. Further, if the initial value (i.e., the value assigned in Step 310) is too high or too low, the iterative approach may require many more iterations, or possibly may not determine a suitable value. This further increases the IC design period.

What is needed is a method for determining the setup and hold times for flip-flops that reduces the time required to design sequential ICs.

SUMMARY OF THE INVENTION

The present invention is directed to an improved method for determining static flip-flop setup and hold times that calculates the setup and hold times using estimated timing delays associated with the transmission of data and clock signals along predetermined paths to specific nodes (gates or switches) within the flip-flops.

In accordance with the present invention, the setup time of a flip-flop is determined by calculating a difference between a first timing delay associated with the transmission of a data signal from a first external node of the flip-flop to an internal node of the flip-flop, and a second timing delay associated with the transmission of a clock signal from a second external node of the flip-flop to the internal node. Determining the first and second timing delays requires, at most, two simulations. Therefore, the method according to the first embodiment significantly reduces the amount of time required to design sequential ICs when compared to conventional methods.

Also in accordance with the present invention, the hold time is determined by calculating a difference between a first timing delay associated with the transmission of a data signal from the first external node to a third internal node of the flip-flop, and a second timing delay associated with the transmission of a clock signal from the second external node to the third internal node. As with the determination of the setup time, determining the first and second timing delays requires, at most, two simulations. Therefore, the method according to the second embodiment significantly reduces the amount of time required to design sequential ICs when compared to conventional methods.

BRIEF DESCRIPTION OF THE DRAWINGS

FIG. 4 is a flowchart showing a method for determining the setup time of a flip-flop in accordance with the present invention.

FIG. 5 is a flowchart showing a method for determining the hold time of a flip-flop in accordance with the present invention.

FIGS. 7A and 7B are simplified circuit diagrams showing operating states of the flip-flop shown in FIG. 6.

DETAILED DESCRIPTION OF THE DRAWINGS

Figure 1:
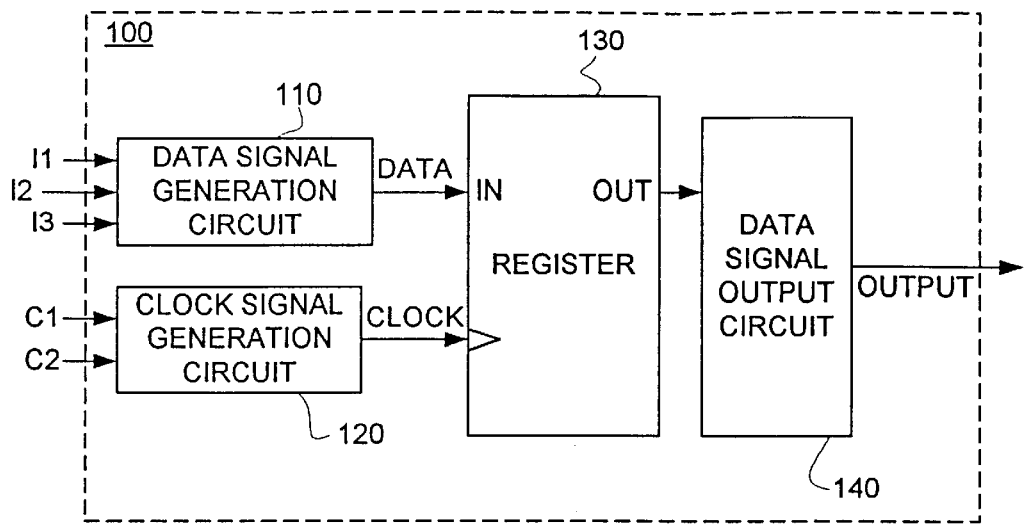
FIG. 1 is a block circuit diagram showing a flip-flop.
Figure 2:
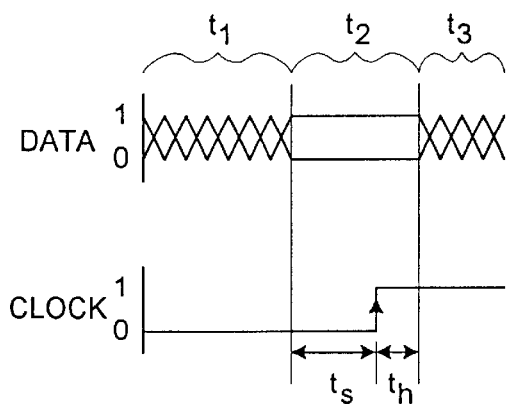
FIG. 2 is a timing diagram showing setup and hold times of a flip-flop.
Figure 3:
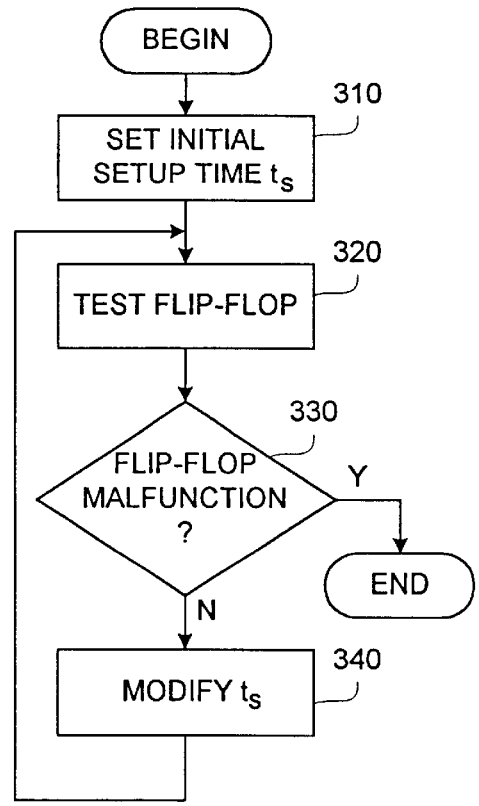
FIG. 3 is a flowchart showing a conventional method for determining the setup and hold times of a flip-flop.

The present invention is directed to an improved method for determining static flip-flop setup and hold times that calculates the setup and hold times using simulated timing delays associated with the transmission of data and clock signals.

FIG. 4 is a flow diagram showing the basic steps associated with a method for determining a setup time $t_s$ of a flip-flop in a sequential IC in accordance with an embodiment of the present invention.

In Step 410, a first time delay period is determined that is associated with the transmission of a data signal along a first path from a first external node located at a data input terminal of a flip-flop to an internal gate (switch) of the flip-flop. In one embodiment, the first time delay is determined using a conventional circuit simulator, such as SPICE, that includes tools for calculating the amount of time required for a signal to be transmitted between two nodes of a circuit. The first time delay period is measured in this way from the first external node through any subsequent circuitry to a terminal of the internal gate. The first external node is located, for example, prior to combinational circuitry of the flip-flop that generates the data signal stored in the register of the flip-flop. The internal gate of the flip-flop is located at the point in the register where the clock signal opens a path through which the data signal sets (or resets) the flip-flop. For example, the internal gate is located in the slave stage of a register whose output sets (or resets) the flip-flop based on the state of the data signal when the clock signal transitions from "0" (low) to "1" (high).

In Step 420, a second time delay period is determined that is associated with the transmission of a clock signal along a second path from a second external node to the internal gate of the flip-flop. The second time delay period is determined, for example, using the conventional circuit simulator that is utilized to determine the first time delay period. The second time delay period is measured in this way from the second external node through any subsequent circuitry used to generate the clock signal to a terminal of the internal gate of the register. The second external node is located, for example, prior to combinational circuitry utilized to generate the clock signal.

In Step 430, the difference between the first (data signal time) delay period and the second (clock signal time) delay period is calculated. Specifically, in one embodiment, the second delay period is subtracted from the first delay period. If the first delay period associated with the transmission of the data signal is greater than the second delay signal associated with the clock signal, then the calculated value is a positive value. Conversely, if the first delay period associated with the transmission of the data signal is less than the second delay signal associated with the clock signal, then the calculated value is a negative value.

In Step 440, the value calculated in Step 430 is stored as the setup time $t_s$ for the flip-flop.

The above method significantly reduces the IC design period by reducing the number of simulations required by the iterative approach used in the conventional method for determining the setup time $t_s$. Specifically, instead of the twenty to thirty simulations required in the conventional method, the present invention requires, at most, two simulations (one to determine the first path, and one to determine the second path). When multiplied by the number of flip-flops found on a typical sequential IC, it is clear that a significant reduction in design time is achieved by the present method.

FIG. 5 is a flow diagram showing the basic steps associated with a method for determining a hold time $t_h$ of a flip-flop in a sequential IC in accordance with another embodiment of the present invention.

In Step 510, a first time delay period is determined that is associated with the transmission of a data signal along a third path from the first external node of the flip-flop to a third internal gate (switch) in the register. The first time delay is determined, for example, using a conventional circuit simulator, such as SPICE, that includes tools for measuring the amount of time required for a signal to be transmitted between two nodes of a circuit. The first time delay period is measured in this way from the first external node through any subsequent combinatorial circuitry used to generate the data signal to a terminal of a third internal gate of the register. The third internal is located at the point in the register where the clock signal opens a path through which the output of, for example, the master stage sets (or resets) the slave stage of the flip-flop.

In Step 520, a second time delay period is determined that is associated with the transmission of a clock signal along a second path from the second external node to the third internal gate in the flip-flop. The second time delay period is determined, for example, using the conventional circuit simulator that is utilized to determine the first time delay period. The second external node is the same node that is used in determining the setup time $t_s$ of the flip-flop. The second time delay period is measured in this way from the second external node through any subsequent circuitry to a control terminal of the third internal gate of the register.

In Step 530, the hold time $t_h$ of the flip-flop is determined by calculating a difference between the first delay period and the second delay period. Specifically, in one embodiment, the second delay period is subtracted from the first delay period.

In Step 550, the value calculated in Step 530 is stored as the hold time $t_h$ for the flip-flop.

As with the method for determining the setup time $t_s$, the above method for determining the hold time $t_h$ significantly reduces the IC design period by reducing the number of simulations required by the iterative approach used in the conventional method for determining the hold time $t_h$.

Examples of the method for determining setup and hold times of a flip-flop will now be described with reference to the sequential ICs shown in FIGS. 6 through 8.

Figure 6:
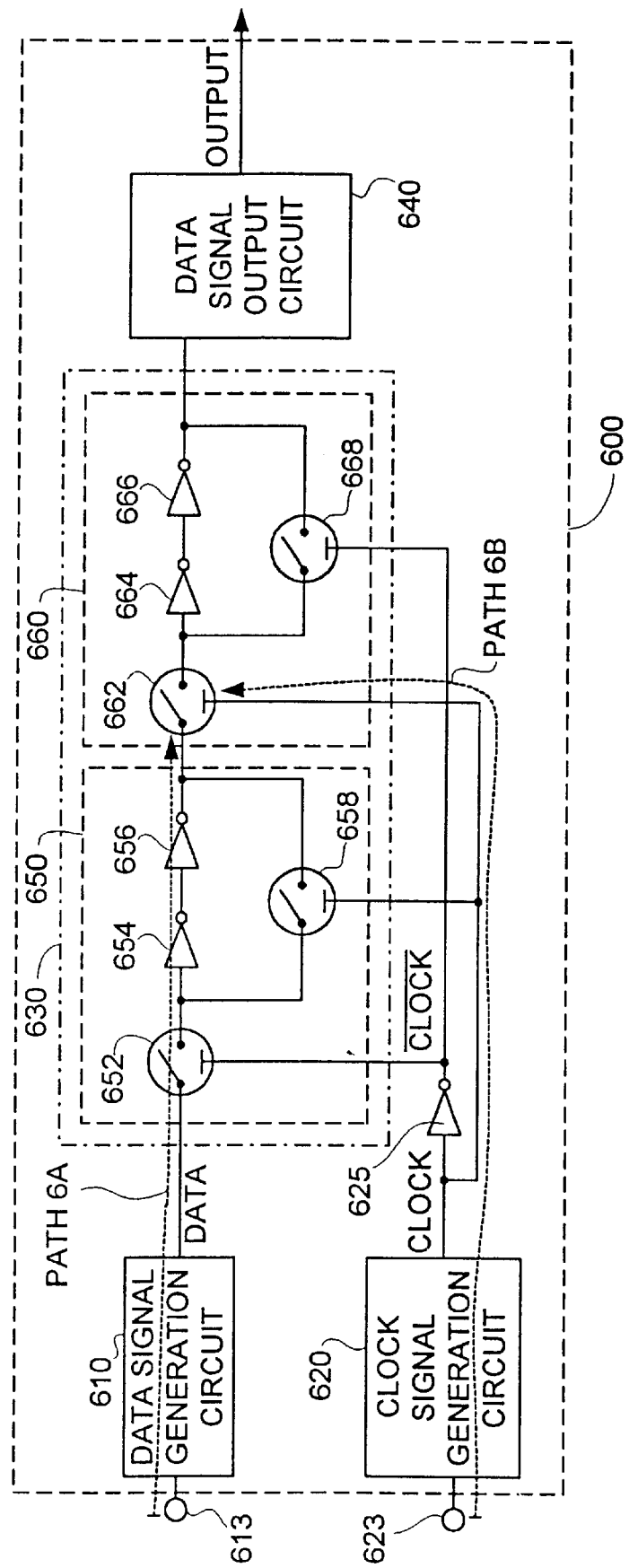
FIG. 6 is a simplified circuit diagram showing flip-flop timing paths utilized in accordance with a first embodiment of the present invention.

FIG. 6 is a simplified schematic showing a portion of a sequential IC including a flip-flop 600. Flip-flop 600 includes a data signal transmission circuit 610, a clock signal transmission circuit 620, a register 630 and a data signal output circuit 640. Data signal generation circuit 610 receives a data input signal at flip-flop data input terminal (first external node) 613 and generates a data signal DATA that is transmitted to register 630. Similarly, clock signal generation circuit 620 receives a clock input signal at flip-flop clock input terminal (second external node) 623, and generates a clock signal CLOCK that is transmitted to register 630 in a true (non-inverted or CLOCK) form, and also in an inverted (CLOCK-BAR) form using inverter 625. Register 630 also includes an output terminal from which a stored data signal is transmitted to data signal output circuit 640. Data signal output circuit 640 transmits a flip-flop output signal OUTPUT in response to the data signal transmitted from register 630.

Register 630 includes a master stage 650 and a slave stage 660. Master stage 650 includes a first switch (gate) 652, a first inverter 654, a second inverter 656 and a second switch 658. First switch 652 is controlled by the CLOCK-BAR signal and controls the transmission of the DATA signal to an input terminal of the first inverter 654. First inverter 654, second inverter 656 and second switch 658 are connected in a loop, with second switch 658 opening and closing the loop in response to the CLOCK signal. The output signal of master stage 650 is transmitted from an output terminal of second inverter 656 to slave stage 660. Slave stage 660 includes a third switch 662, a third inverter 664, a fourth inverter 666 and a fourth switch 668. Third switch 662 is connected between the output terminal of master stage 650 and the input terminal of third inverter 664, and controls the transmission of signals from master stage 650 to third inverter 664 in response to the CLOCK signal. Third inverter 664, fourth inverter 666 and fourth switch 668 are connected in a loop, with second switch 658 opening and closing the loop in response to the CLOCK-BAR signal.

As shown in FIGS. 7A and 7B, master stage 650 and slave stage 660 are alternately enabled by the CLOCK and CLOCK-BAR signals such that the DATA signal is shifted into slave stage 660 when master stage 650 is isolated from data signal generation circuit 610.

Referring to FIG. 7A, when the CLOCK signal is low (CLOCK-BAR is high), second switch 658 and third switch 662 are open, and first switch 652 and fourth switch 668 are closed. At this time, slave stage 660 is isolated from master stage 650 because of open third switch 662, and master stage 650 is enabled to receive the DATA signal because of closed first switch 652. Specifically, first inverter 654 receives and inverts the DATA signal transmitted through closed first switch 652, and second inverter 656 re-inverts the inverted DATA signal generated by first inverter 654. Note that open second switch 658 prevents the signal transmitted from second inverter 656 from also being applied to the input terminal of first inverter 654. Also at this time, slave stage 660 is enabled to transmit a previously-stored data signal to data signal output circuit 640 without being affected by the DATA signal received by master stage 650. Specifically, third inverter 664 is isolated from master stage 650 by open third switch 662, and receives and inverts a signal transmitted from fourth inverter 666 through closed fourth switch 668, and the signal transmitted from fourth inverter 666 is also transmitted to data signal output circuit 640.

Referring to FIG. 7B, when the CLOCK signal is high (CLOCK-BAR is low), second switch 658 and third switch 662 are closed, and first switch 652 and fourth switch 668 are open. At this time, slave stage 660 is enabled to receive the DATA signal stored in master stage 650 because of closed third switch 662, and master stage 650 is isolated from data signal generation circuit 610 because of open first switch 652. Specifically, first inverter 654 receives and inverts the DATA signal transmitted from second inverter 656 through closed second switch 658, and second inverter 656 re-inverts the inverted DATA signal generated by first inverter 654, thereby forming a loop which stores the DATA signal. This stored DATA signal is transmitted through closed third switch 662 of slave stage 660 to the input terminal of third inverter 664. Third inverter 664 receives and inverts the DATA signal transmitted from second inverter 656 through closed third switch 662, and fourth inverter 666 re-inverts the inverted DATA signal generated by third inverter 664. Note that open fourth switch 668 prevents the signal transmitted from fourth inverter 666 from also being applied to the input terminal of third inverter 664.

Referring again to FIG. 6, the setup time $t_s$ for flip-flop 600 is determined using, at most, two simulations of the IC. Specifically, a first simulation is performed to determine the delay period associated with the transmission of data signal DATA from first external node 613 along path 6A to a terminal of third switch 662 (i.e., through data signal generation circuit 610, first switch 652, first inverter 654 and second inverter 656). Path 6A represents the maximum delay period associated with the transmission of a data signal from an input terminal of flip-flop 600 to slave stage 660 of register 630. This path is selected because the data signal must reach this internal node of flip-flop 630 before the clock signal edge in order for flip-flop 600 to function properly (i.e., successfully store the data signal in master stage 650). In one embodiment, a second simulation is performed to determine the delay period associated with the transmission of clock signal CLOCK from second node 650 along path 6B to the control terminal of third switch 662. In an alternative embodiment, the signal delay associated with path 6B is determined during the first simulation (if this is feasible). The termination point of path 6B is determined by path 6A. Specifically, path 6B terminates at the same switch as path 6A, so path 6B terminates at third switch 652. After the delay periods associated with paths 6A and 6B are determined, the setup time $t_s$ associated with flip-flop 600 is easily calculated by subtracting the delay time for path 6B from the delay time for path 6A.

Figure 8:
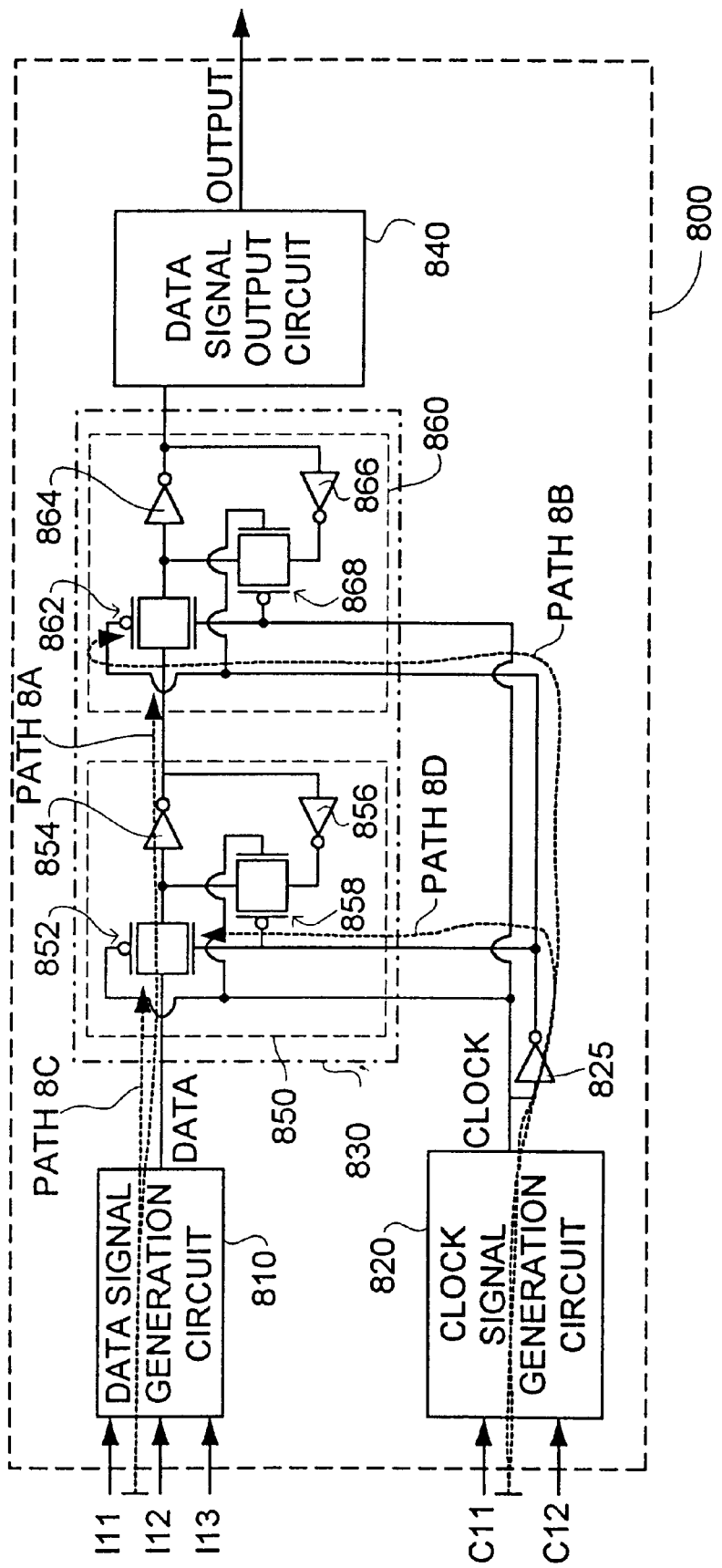
FIG. 8 is a simplified circuit diagram showing flip-flop timing paths utilized in accordance with a second embodiment of the present invention.

FIG. 8 is a simplified schematic showing a flip-flop 800 including a data signal generation circuit 810, a clock signal generation circuit 820, a register 830 and a data signal reception circuit 840.

Register 830 includes a master stage 850 and a slave stage 860. Master stage 850 includes a first CMOS transmission gate 852, a first inverter 854, a second inverter 856 and a second CMOS transmission gate 858. First inverter 854, second inverter 856 and second transmission gate 858 are connected in a loop and connected to a terminal of first transmission gate 852. The output signal of master stage 850 is transmitted from first inverter 854. Slave stage 860 includes a third CMOS transmission gate 862, a third inverter 864, a fourth inverter 866 and a fourth CMOS transmission gate 868. Third transmission gate 862 receives the output signal transmitted from master stage 850. Third inverter 864, fourth inverter 866 and fourth transmission gate 868 are connected in a loop and connected to a terminal of first transmission gate 862. Master stage 850 and slave stage 860 operate in a manner consistent with that described above with respect to flip-flop 600.

In accordance with the second example, flip-flop 800 receives a data input signals I11, I12 and I13 that are transmitted to data signal generation circuit 810, and clock input signals C11 and C12 that are transmitted to clock signal generation circuit 820. Data signal generation circuit 810 generates a data signal (DATA) that is transmitted to master stage 850 of register 830. The non-inverted CLOCK signal is transmitted in a true (non-inverted or CLOCK) form to the PMOS control gates of first transmission gate 852 of master stage 850 and fourth transmission gate 868 of slave stage 860, and to the NMOS control gates of second transmission gate 858 and third transmission gate 862. The inverted CLOCK signal is transmitted to the PMOS control gates of second transmission gate 858 and third transmission gate 862, and to the NMOS control gates of first transmission gate 852 and fourth transmission gate 868.

In accordance with the second example, the setup time $t_s$ for flip-flop 830 is determined using, at most, two simulations of the IC incorporating flip-flop 800. Specifically, a first simulation is performed to determine the delay period associated with the propagation of a data input signal along path 8A through data signal generation circuit 810 to the first terminal of third transmission gate 862. Path 8A passes through first transmission gate 852 and first inverter 854 to the terminal of third transmission gate 862 in slave stage 860. Similar to the first example, path 8A is selected because it represents the longest path over which the data signal D is transmitted before reaching third transmission gate 862 that is controlled by the inverted clock signal. Similar to the first example, path 8A is selected because the data input signal must propagate through data signal generation circuit 810 and slave stage 850 before the inverted clock signal reaches the control terminal of third transmission gate 862 in order for flip-flop 830 to function properly. In one embodiment, a second simulation is performed to determine the delay period associated with the propagation of the inverted clock signal from the clock signal input terminal of flip-flop 800 and through clock signal generation circuit 820 along path 8B to the PMOS control terminal of third transmission gate 862. In an alternative embodiment, the signal delay associated with path 8B is determined during the first simulation (if this is feasible). The termination point of path 8B is determined by path 8A. Specifically, path 8B terminates at the control terminals of third transmission gate 862 because this node controls signal transmissions into slave stage 860. After the delay periods associated with paths 8A and 8B are determined, the setup time $t_s$ associated with flip-flop 800 is easily calculated by subtracting the delay time for path 8B from the delay time for path 8A.

Also in accordance with the second example, the hold time $t_h$ for flip-flop 800 is determined by simulation. Specifically, a first simulation is performed to determine the delay period associated with the propagation of data input signals through data signal generation circuit 810 to first transmission gate 852 in master stage 850 along path 8C. Similar to the above examples, this path is selected because the data signal must reach first transmission gate 852 before clock signal CLOCK in order for flip-flop 800 to function properly. In one embodiment, a second simulation is performed to determine the delay period associated with the propagation of the inverted clock signal through clock signal generation circuit 820 and inverter 825 along path 8D to the NMOS control terminal of second transmission gate 868. In an alternative embodiment, the signal delay associated with path 8D is determined during the first simulation (if this is feasible). The termination point of path 8D is determined by path 8C. Specifically, path 8D terminates at the control terminals of first transmission gate 852. After the delay periods associated with paths 8C and 8D are determined, the hold time $t_h$ associated with flip-flop 800 is easily calculated by subtracting the delay time for path 8D from the delay time for path 8C.

Although the present invention has been described with respect to certain specific embodiments, it will be clear to those skilled in the art that the inventive features of the present invention are applicable to other embodiments as well, all of which are intended to fall within the scope of the present invention.

I claim:

1. A method for determining a setup time for a flip-flop in an integrated circuit comprising:

using simulation to determine a first delay period associated with the transmission of a data signal along a first path from a first external node to an internal node that is located within a register of the flip-flop;

using simulation to determine a second delay period associated with the transmission of a clock signal along a second path from a second external node to the internal node; and calculating the setup time of the flip-flop by determining a difference between the first delay period and the second delay period.

2. The method according to claim 1, wherein determining the first delay period comprises performing a first simulation of the integrated circuit; and wherein determining the second delay period is performed during the first simulation of the integrated circuit.

3. The method according to claim 1, wherein calculating the setup time of the flip-flop comprises subtracting the second delay period from the first delay period.

4. A method for determining a setup time for a flip-flop in an integrated circuit:

using simulation to determine a first delay period associated with the transmission of a data signal along a first path from a first external node through a data signal generation circuit to an internal node that is located within a slave stage of the flip-flop;

using simulation to determine a second delay period associated with the transmission of a clock signal along a second path from a second external node through a clock signal generation circuit to the internal node; and calculating the setup time of the flip-flop by determining a difference between the first delay period and the second delay period.

5. The method according to claim 4, wherein determining the first delay period comprises performing a first simulation of the integrated circuit; and wherein determining the second delay period is performed during the first simulation of the integrated circuit.

6. The method according to claim 4, wherein determining the first delay period comprises performing a first simulation of the integrated circuit; and wherein determining the second delay period comprises performing a second simulation of the integrated circuit.

7. The method according to claim 4, wherein calculating the setup time of the flip-flop comprises subtracting the second delay period from the first delay period.

8. A method for determining a hold time for a flip-flop in an integrated circuit comprising:

using simulation to determine a first delay period associated with the transmission of a data signal along a first path from a first external node to an internal node located within a master stage of the flip-flop;

using simulation to determine a second delay period associated with the transmission of a clock signal along a second path from a second external node through a clock signal generation circuit to the internal node; and calculating the hold time of the flip-flop by determining a difference between the first delay period and the second delay period.

9. The method according to claim 8, wherein determining the first delay period comprises performing a first simulation of the integrated circuit; and wherein determining the second delay period is performed during the first simulation of the integrated circuit.

10. The method according to claim 8, wherein calculating the hold time of the flip-flop comprises subtracting the second delay period from the first delay period.

* * * * *